US010319415B2

(12) United States Patent
Doody et al.

(10) Patent No.: US 10,319,415 B2
(45) Date of Patent: Jun. 11, 2019

(54) PRINTED MEMORY GRID CONNECTOR

(71) Applicant: XEROX CORPORATION, Norwalk, CT (US)

(72) Inventors: Michael A. Doody, Manchester, NY (US); Karl E. Kurz, Rochester, NY (US)

(73) Assignee: XEROX CORPORATION, Norwalk, CT (US)

( * ) Notice: Subject to any disclaimer, the term of this patent is extended or adjusted under 35 U.S.C. 154(b) by 33 days.

(21) Appl. No.: 15/498,219

(22) Filed: Apr. 26, 2017

(65) Prior Publication Data

US 2018/0315456 A1    Nov. 1, 2018

(51) Int. Cl.
*G11C 5/02* (2006.01)
*H01L 23/00* (2006.01)
*G01R 1/073* (2006.01)

(52) U.S. Cl.
CPC ............... *G11C 5/02* (2013.01); *G01R 1/073* (2013.01); *H01L 24/09* (2013.01)

(58) Field of Classification Search
CPC ......... G11C 7/00; G11C 5/00; G11C 11/4063; G11C 11/413; G11C 7/005; H01L 24/09; H01L 24/10
See application file for complete search history.

(56) References Cited

U.S. PATENT DOCUMENTS

2010/0274447 A1*  10/2010  Stumpf ................... G01D 1/00
                                                              701/36
2017/0068830 A1*   3/2017  Fowler ................ G06K 7/0013

* cited by examiner

*Primary Examiner* — Fernando L Toledo
*Assistant Examiner* — Lawrence-Lin T Nguyen
(74) *Attorney, Agent, or Firm* — MH2 Technology Law Group LLP

(57) ABSTRACT

A grid connector for communicating with a printed memory includes a substrate and a plurality of first conductive pads coupled to the substrate. Each of the first conductive pads protrudes outward with respect to an outer surface of the substrate. A subset of the first conductive pads is configured to contact a second conductive pad of the printed memory, regardless of an orientation of the printed memory with respect to the grid connector as long as the second conductive pad is within a boundary of the first conductive pads.

20 Claims, 5 Drawing Sheets

PRINTED MEMORY GRID CONNECTOR

TECHNICAL FIELD

The present teachings relate generally to printed memory and, more particularly, to systems and methods for communicating with printed memory.

BACKGROUND

A printed memory is a thin, flexible, adhesive-backed device (e.g., similar to a stamp) that is manufactured through a sequential layering process. The printed memory includes conductive pads through which digital data may be transmitted (e.g., written to the printed memory and/or read from the printed memory). The data may include information about a product to which the printed memory is adhered.

Conventionally, to transmit the data to and/or receive the data from the printed memory, the conductive pads are physically contacted by spring-loaded pogo pins, ZEBRA® connectors, or leaf spring connectors. However, these pins/connectors each require precise 1:1 alignment with the conductive pads to transmit the data. What is needed is an improved system and method for communicating with the printed memory.

SUMMARY

The following presents a simplified summary in order to provide a basic understanding of some aspects of one or more embodiments of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

A grid connector for communicating with a printed memory includes a substrate and a plurality of first conductive pads coupled to the substrate. Each of the first conductive pads protrudes outward with respect to an outer surface of the substrate. A subset of the first conductive pads is configured to contact a second conductive pad of the printed memory, regardless of an orientation of the printed memory with respect to the grid connector as long as the second conductive pad is within a boundary of the first conductive pads.

A system for communicating with a printed memory includes a printed memory, a grid connector, and a computing system. The printed memory includes a first substrate and a plurality of first conductive pads coupled to the first substrate. Each of the first conductive pads is recessed with respect to an outer surface of the first substrate. The grid connector includes a second substrate and a plurality of second conductive pads coupled to the second substrate. Each of the second conductive pads protrudes outward with respect to an outer surface of the second substrate. Different subsets of the second conductive pads are configured to contact each of the first conductive pads, regardless of an orientation of the printed memory with respect to the grid connector as long as the first conductive pads are within a boundary of the second conductive pads. Each subset includes two or more of the second conductive pads. The computing system is in communication with the grid connector. The computing system is configured to communicate with the printed memory via the grid connector when the different subsets of the second conductive pads are in contact with each of the first conductive pads.

A method for communicating with a printed memory includes placing a grid connector in contact with the printed memory. The printed memory includes a first conductive pad. The grid connector includes a plurality of second conductive pads. Placing the grid connector in contact with the printed memory includes placing a subset of the second conductive pads of the grid connector in contact with the first conductive pad of the printed memory, regardless of an orientation of the printed memory with respect to the grid connector as long as the first conductive pad is within a boundary of the second conductive pads. The method also includes transmitting data between the first conductive pad of the printed memory and the subset of the second conductive pads of the grid connector.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures.

DETAILED DESCRIPTION

Reference will now be made in detail to exemplary embodiments of the present teachings, examples of which are illustrated in the accompanying drawings. Wherever possible, the same reference numbers will be used throughout the drawings to refer to the same, similar, or like parts.

Figure 1:
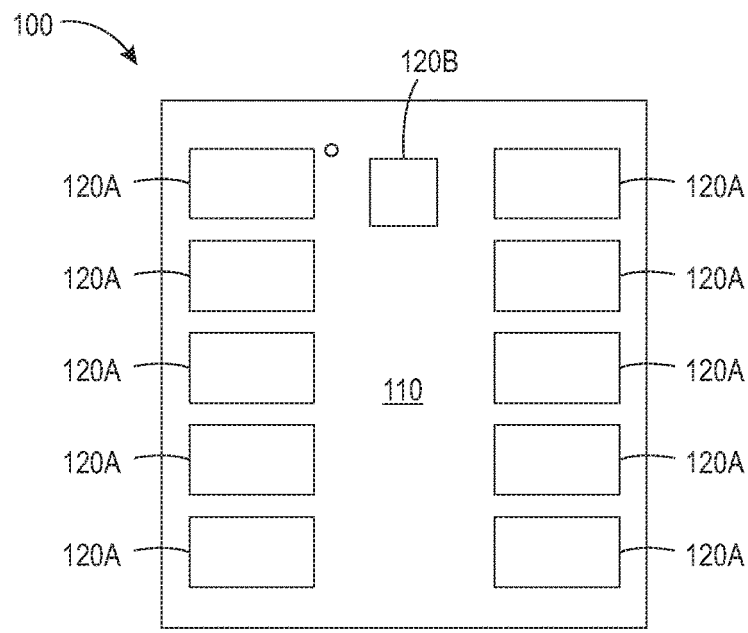
FIG. 1 depicts a top view of a printed memory, according to an embodiment.

FIG. 1 depicts a top view of a printed memory 100, according to an embodiment. The printed memory 100 may include a thin, flexible substrate 110. The substrate 110 may include rewritable memory. For example, the rewritable memory may include 36 bits that can store up to about 68 billion points of data.

The printed memory 100 may also include one or more conductive pads (eleven are shown: 120A, 120B) coupled to the substrate 110. The conductive pads 120A, 120B may be made from a metal or metal alloy. The conductive pads 120A, 120B may be recessed with respect to an upper/outer surface of the substrate 110.

Figure 2:
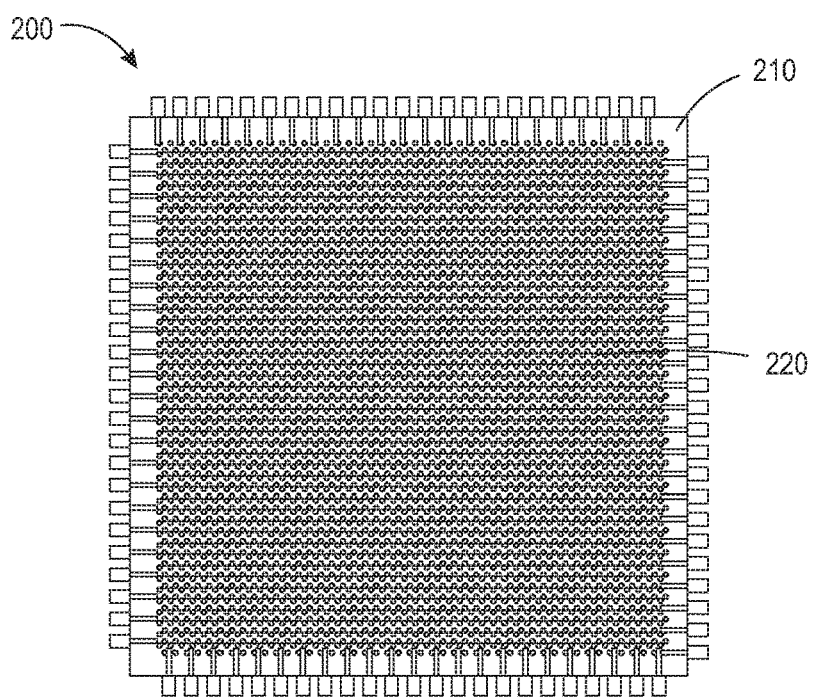
FIG. 2 depicts a top view of a grid connector, according to an embodiment.

FIG. 2 depicts a top view of a grid connector, 200 according to an embodiment. The grid connector 200 may be part of (e.g., coupled to) a data transmission device that is used to communicate with the printed memory 100. More particularly, the grid connector 200 may be configured to transmit (i.e., write) data to the printed memory 100 and/or receive (i.e., read) data from the printed memory 100. The grid connector 200 may include a thin substrate 210. The substrate 210 may be made from silicon. The grid connector 200 (e.g., the substrate 210) may act as a mechanical engagement between the printed memory 100 and the computing system (see FIG. 7) of the data transmission device.

The grid connector 200 may also include a plurality of conductive pads 220. The conductive pads 220 may be made from a metal or metal alloy. The conductive pads 220 may protrude outward with respect to an upper/outer surface of the substrate 210.

Figure 3:
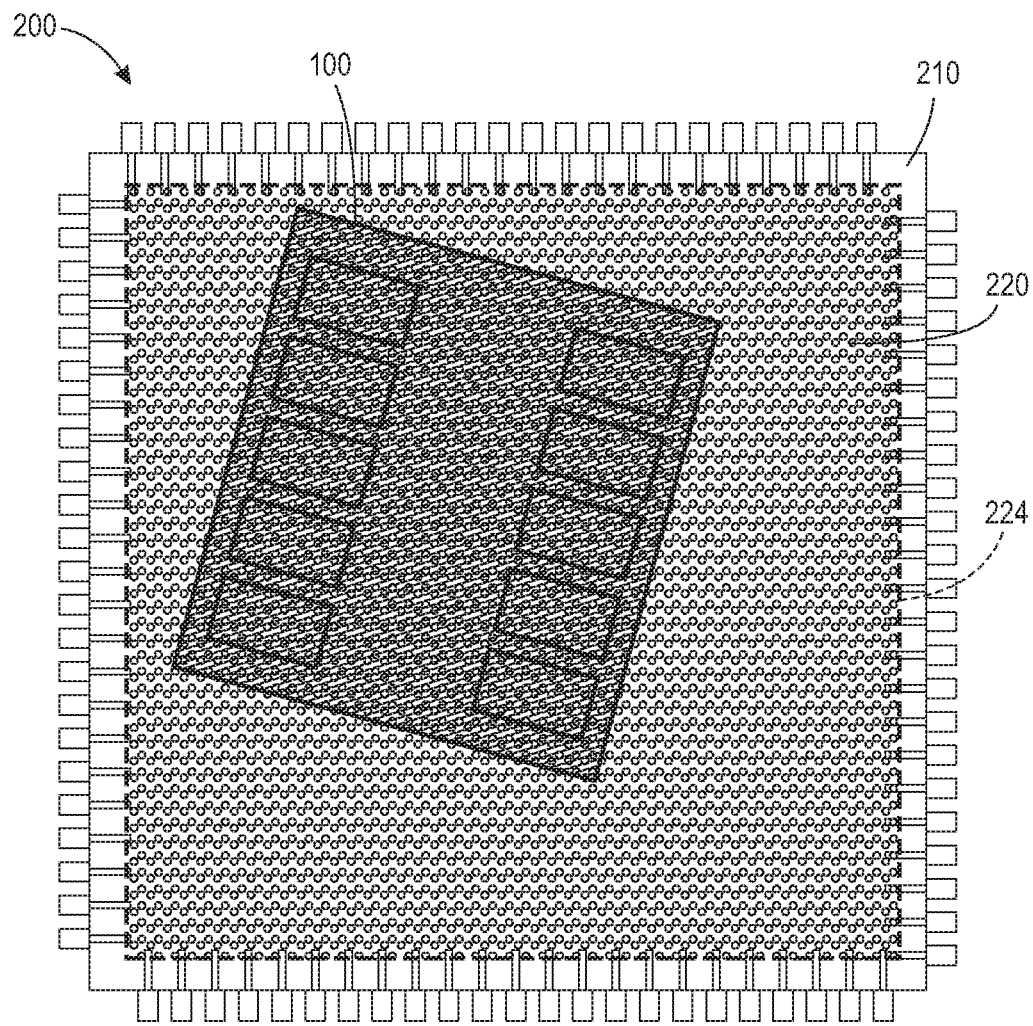
FIG. 3 depicts a top view of the printed memory contacting the grid connector, according to an embodiment.
Figure 4:
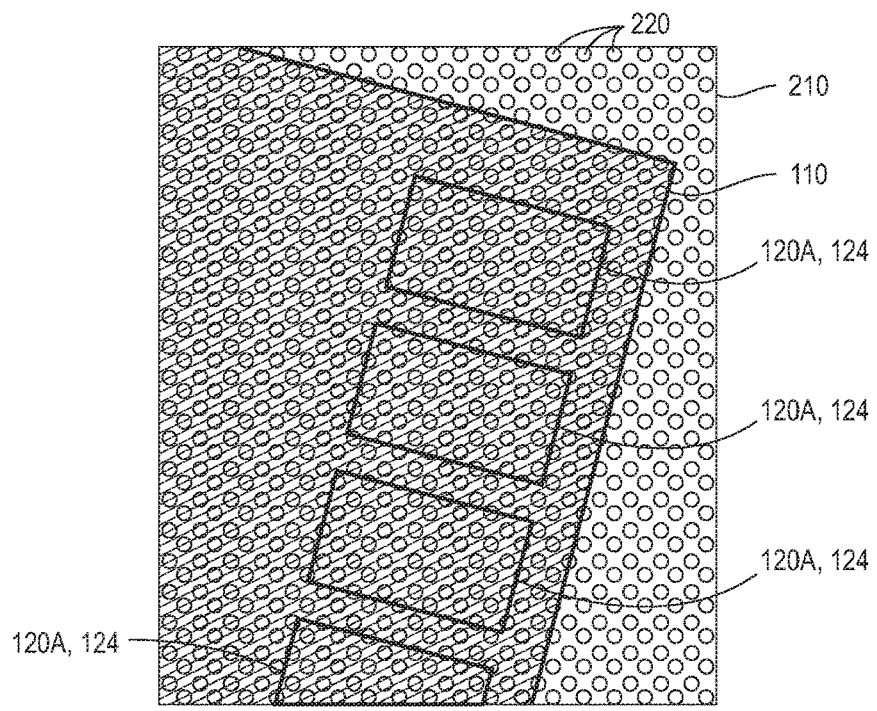
FIG. 4 depicts an enlarged top view of a portion of FIG. 3, according to an embodiment.

FIG. 3 depicts a top view of the printed memory 100 contacting the grid connector 200, and FIG. 4 depicts an enlarged top view of a portion of FIG. 3, according to an embodiment. More particularly, FIGS. 3 and 4 depict the printed memory 100 facing down with the conductive pads 120A, 120B contacting the conductive pads 220 of the grid connector 200, which is facing up. The printed memory 100 is shown transparent in FIGS. 3 and 4.

The substrate 110 of the printed memory 100 may have a smaller surface area than the substrate 210 of the grid connector 200. The conductive pads 120A, 120B of the printed memory 100 may each have a larger surface area than the conductive pads 220 of the grid connector 200. As a result, unlike conventional spring-loaded pogo pins, ZEBRA® connectors, leaf spring connectors, etc., the conductive pads (e.g., a plurality of the conductive pads) 220 of the grid connector 200 may be aligned with and physically contact each conductive pad 120A, 120B of the printed memory 100, regardless of the position and/or orientation of the printed memory 110 with respect to the grid connector 200. In other words, the printed memory 100 may be moved and/or rotated with respect to the grid connector 200, and as long as the conductive pads 120A, 120B of the printed memory 100 remain within a perimeter/boundary 224 of the conductive pads 220 of the grid connector 200, the conductive pads (e.g., a plurality of the conductive pads) 220 of the grid connector 200 may be aligned with and physically contact each conductive pad 120A, 120B of the printed memory 100.

The conductive pads 220 of the grid connector 200 that are in contact with the conductive pads 120A, 120B of the printed memory 100 may exhibit electrical continuity between one another (e.g., through the conductive pads 120A, 120B). However, the conductive pads 220 of the grid connector 200 that are not in contact with the conductive pads 120A, 120B of the printed memory 100 may not exhibit electrical continuity between one another. As described in greater detail below, this may allow the a computing system (see FIG. 7) in the data transmission device to determine/identify the subset(s) of the conductive pads 220 of the grid connector 200 that are in contact with the conductive pads 120A, 120B of the printed memory 100. Each subset may include a plurality of conductive pads 220 (e.g., from about 5 to about 30 or about 10 to about 20).

Once the subset(s) of the conductive pads 220 that are in contact with the conductive pads 120A, 120B of the printed memory 100 are identified, the computing system may also determine/identify the conductive pads 220 in the subset(s) that are within a predetermined distance of a boundary 124 of the conductive pads 120A, 120B. For example, the boundary conductive pads may be aligned with or at least partially overlap the boundary 124 of the conductive pads 120A, 120B. As a result, the contact between the boundary conductive pads and the conductive pads 120A, 120B may be less reliable than the conductive pads 220 that are positioned within the boundary 124 and greater than the predetermined distance from the boundary 124.

When the conductive pads 120A, 120B of the printed memory 100 are in contact with the conductive pads 220 of the grid connector 200, data may be transmitted between the printed memory 100 and the grid connector 200. More particularly, digital data may be transmitted from the grid connector 200, through the conductive pads 120A, 120B, 220, and stored in the rewritable memory in the substrate 110 of the printed memory 100 (e.g., as part of a writing function). Alternatively, digital data may be transmitted from the rewritable memory in the substrate 110, through the conductive pads 120A, 120B, 220, and to the grid connector 200 (e.g., as part of a reading function).

The data transmitted through the conductive pads 120A may be or include information about a product to which the printed memory 100 is coupled (e.g., adhered). For example, the data may be or include the date the product was manufactured, the place the product was manufactured, the expiration date of the product, or the like. The printed memory 100 may also keep track of ongoing operational data of a system. This works when the printed memory 100 is attached to a subsystem or subassembly of a larger system. For example, the printed memory 100 may keep track of the number of copies a print cartridge (e.g., subsystem) has made in a copier (e.g., larger system), track how much water has passed through a filter in a refrigerator, track how many faults occurred while the subsystem was running in any number of larger systems, or the like. The data may also be or include encryption data to prevent counterfeiting of the product. The conductive pad 120B may enable the data transmission device (of which the grid connector 200 is a part) to determine the position and/or orientation of each of the conductive pads 120A of the printed memory 100 with respect to the printed memory 100 and/or the grid connector 200. In at least one embodiment, the data transmitted through the conductive pads 120A may not include position/orientation information, and the conductive pad 120B may not include information about the product to which the printed memory 100 is coupled.

Figure 5:
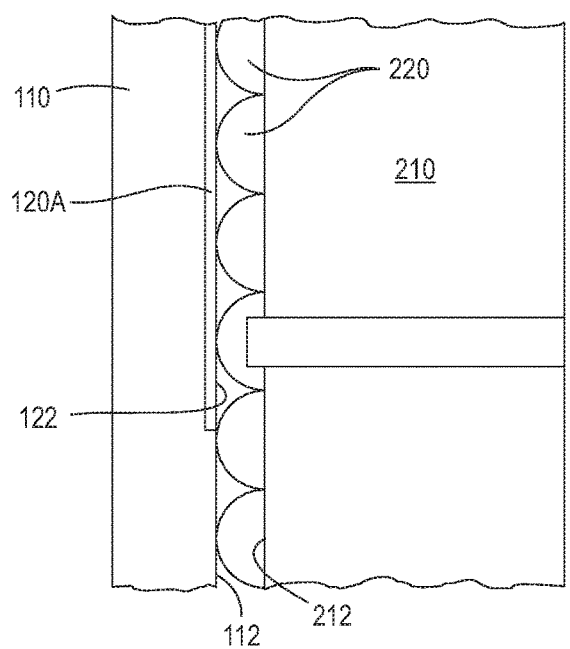
FIG. 5 depicts a cross-sectional side view of a portion of the printed memory contacting a portion of the grid connector, according to an embodiment.

FIG. 5 depicts a cross-sectional side view of a portion of the printed memory 100 contacting a portion of the grid connector 200, according to an embodiment. The conductive pads 120A, 120B may be positioned within a recess in the substrate 110. An upper/outer surface 122 of the conductive pads 120A, 120B may be recessed by a distance with respect to an upper/outer surface 112 of the substrate 110. The distance may be, for example, about 0.001 inches.

The conductive pads 220 of the grid connector 200 may protrude outward from the upper/outer surface 212 of the substrate 210 by a distance. The distance may be, for example, about 0.005 inches. This may allow the conductive pads 220 of the grid connector 200 to contact the recessed conductive pads 120A, 120B of the printed memory 100.

Figure 6:
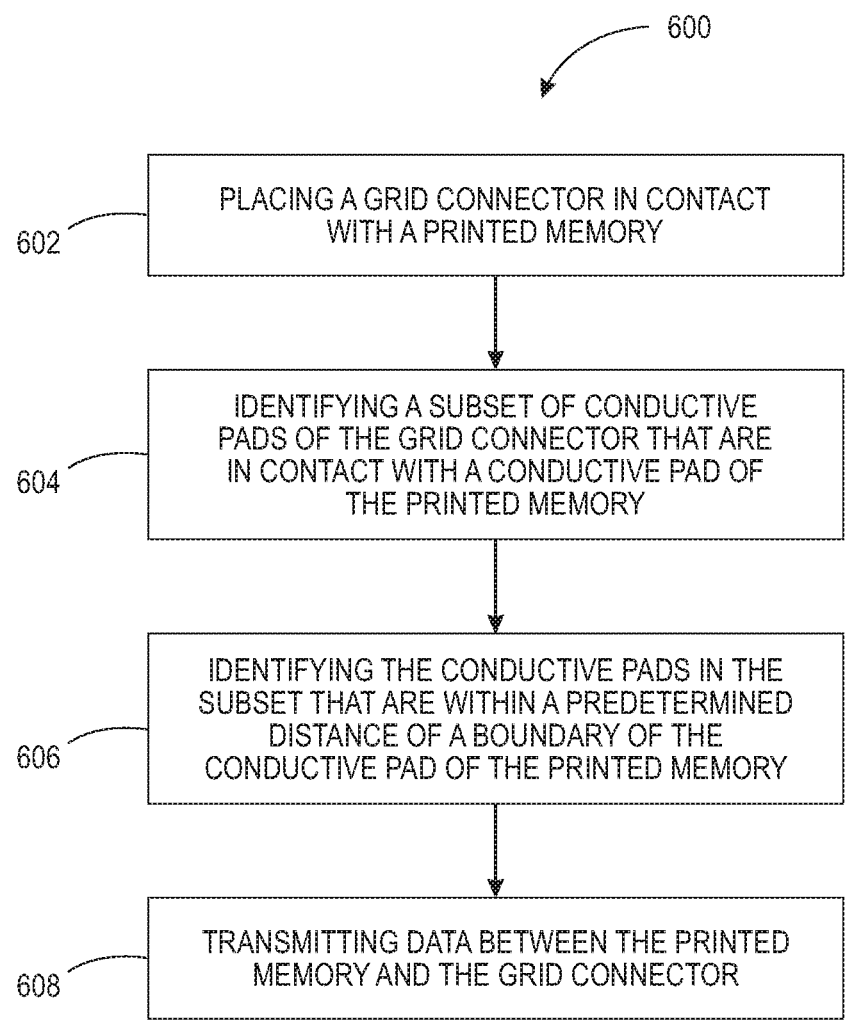
FIG. 6 depicts a flowchart of a method for transmitting data between the printed memory and the grid connector, according to an embodiment.

FIG. 6 depicts a flowchart of a method 600 for transmitting data between the printed memory 100 and the grid connector 200, according to an embodiment. The method 600 may include placing the grid connector 200 in contact with the printed memory 100, as at 602. More particularly, a plurality of the conductive pads 220 of the grid connector 200 may be placed in contact with each of the conductive pads 120A, 120B of the printed memory 100.

The method 600 may also include identifying a subset of the conductive pads 220 of the grid connector 200 that are in contact with the conductive pads 120A, 120B of the printed memory 100, as at 604. More particularly, the computing system (see FIG. 7) may identify the subset by determining that the conductive pads 220 in the subset have electrical continuity with one another. The method 600 may also include identifying the conductive pads 220 in the subset that are within a predetermined distance of the boundary 124 of each conductive pad 120A, 120B, as at 606.

The method 600 may also include transmitting data between the printed memory 100 and the grid connector 200, as at 608. More particularly, the data may be transmitted between the conductive pads 120A, 120B of the printed memory 100 and the subset of conductive pads 220 of the grid connector 200. In at least one embodiment, the data may not be transmitted through the conductive pads 220 in the subset that are within the predetermined distance of the boundary 124 of each conductive pad 120A, 120B.

Figure 7:
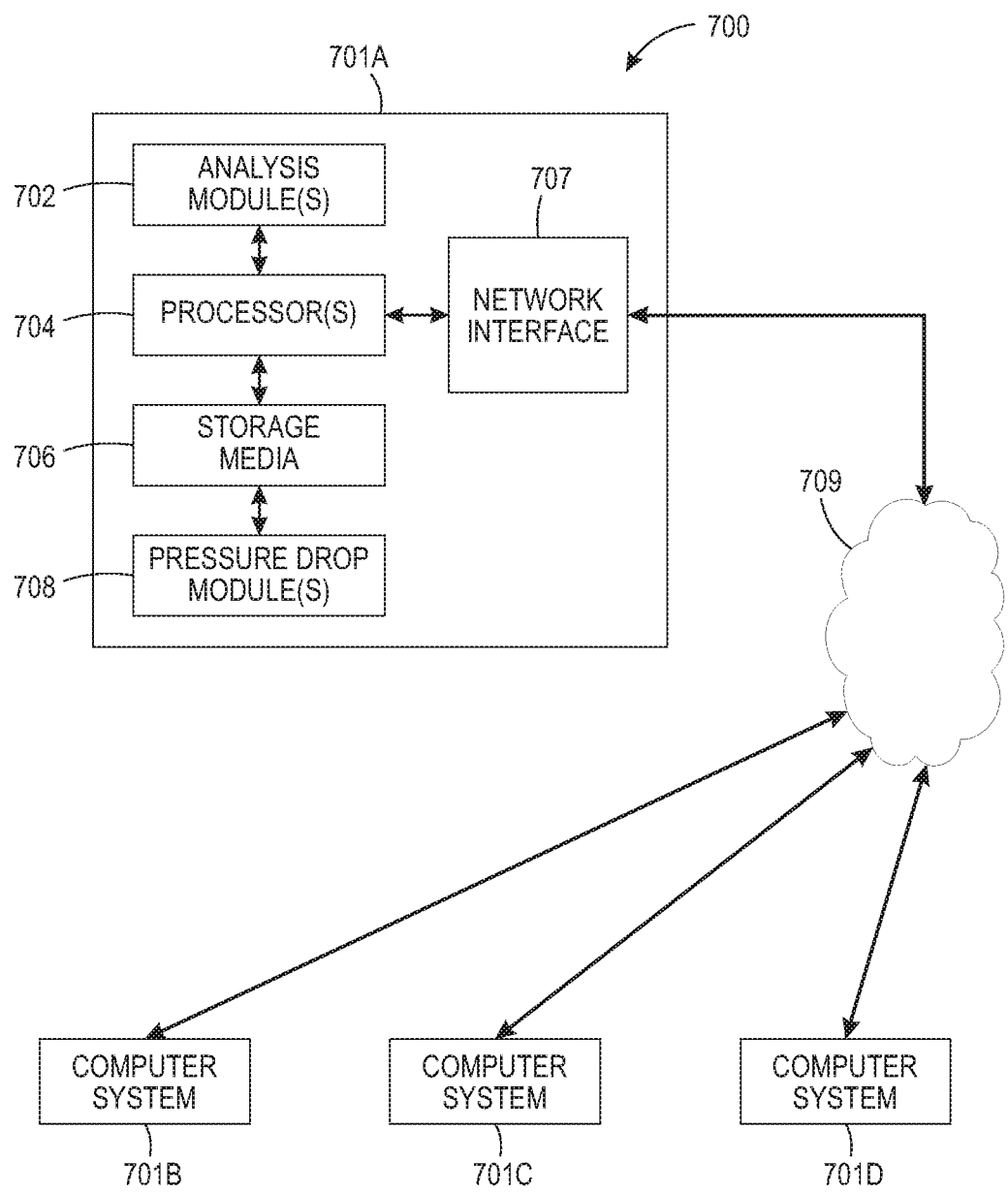
FIG. 7 depicts a computing system for performing at least a portion of the method, according to an embodiment.

FIG. 7 illustrates an example of such a computing system 700, in accordance with some embodiments. The computing system 700 may be part of the data transmission device and thus in communication with the grid connector 200. The computing system 700 may include a computer or computer system 701A, which may be an individual computer system 701A or an arrangement of distributed computer systems. The computer system 701A includes one or more analysis module(s) 702 configured to perform various tasks according to some embodiments, such as one or more methods disclosed herein. To perform these various tasks, the analysis module 702 executes independently, or in coordination with, one or more processors 704, which is (or are) connected to one or more storage media 706. The processor(s) 704 is (or are) also connected to a network interface 707 to allow the computer system 701A to communicate over a data network 709 with one or more additional computer systems and/or computing systems, such as 701B, 701C, and/or 701D (note that computer systems 701B, 701C and/or 701D may or may not share the same architecture as computer system 701A, and may be located in different physical locations, e.g., computer systems 701A and 701B may be located in a processing facility, while in communication with one or more computer systems such as 701C and/or 701D that are located in one or more data centers, and/or located in varying countries on different continents).

A processor can include a microprocessor, microcontroller, processor module or subsystem, programmable integrated circuit, programmable gate array, or another control or computing device.

The storage media 706 can be implemented as one or more computer-readable or machine-readable storage media. Note that while in the example embodiment of FIG. 7 storage media 706 is depicted as within computer system 701A, in some embodiments, storage media 706 may be distributed within and/or across multiple internal and/or external enclosures of computing system 701A and/or additional computing systems. Storage media 706 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLU-RAY® disks, or other types of optical storage, or other types of storage devices. Note that the instructions discussed above can be provided on one computer-readable or machine-readable storage medium, or can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In some embodiments, computing system 700 contains one or more data transmission module(s) 708. In the example of computing system 700, computer system 701A includes the data transmission module 708. In some embodiments, a single data transmission module may be used to perform at least some aspects of one or more embodiments of the method 600. In other embodiments, a plurality of data transmission modules may be used to perform at least some aspects of the method 600.

It should be appreciated that computing system 700 is one example of a computing system, and that computing system 700 may have more or fewer components than shown, may combine additional components not depicted in the example embodiment of FIG. 7, and/or computing system 700 may have a different configuration or arrangement of the components depicted in FIG. 7. The various components shown in FIG. 7 may be implemented in hardware, software, or a combination of both hardware and software, including one or more signal processing and/or application specific integrated circuits.

Further, the steps in the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of protection of the invention.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" may include any and all sub-ranges between (and including) the minimum value of zero and the maximum value of 10, that is, any and all sub-ranges having a minimum value of equal to or greater than zero and a maximum value of equal to or less than 10, e.g., 1 to 5.

While the present teachings have been illustrated with respect to one or more implementations, alterations and/or modifications may be made to the illustrated examples without departing from the spirit and scope of the appended claims. For example, it may be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It may be appreciated that structural objects and/or processing stages may be added, or existing structural objects and/or processing stages may be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items may be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. The terms "couple," "coupled," "connect," "connection," "connected," "in connection with," and "connecting" refer to "in direct connection with" or "in connection with via one or more intermediate elements or members." Finally, the terms "exemplary" or "illustrative" indicate the description is used as an example, rather than implying that it is an ideal. Other embodiments of the present teachings may be apparent to those skilled in the art from consideration of the specification and practice of the disclosure herein. It is intended that the specification and examples be considered as exemplary only, with a true scope and spirit of the present teachings being indicated by the following claims.

What is claimed is:

1. A grid connector for communicating with a printed memory, comprising: a substrate; and a plurality of first conductive pads coupled to the substrate, wherein each of the first conductive pads protrudes outward with respect to an outer surface of the substrate, and wherein a subset of the first conductive pads is configured to directly contact a second conductive pad of the printed memory, to allow data to be transmitted between the grid connector and the printed memory when the grid connector is at a 1:1 alignment with respect to the printed memory or at any other angle regardless of an orientation of the printed memory, with respect to the printed memory as long as the second conductive pad is within a boundary of the first conductive pads.

2. The grid connector of claim 1, wherein the grid connector is configured to transmit the data to the printed memory when the subset of the first conductive pads contacts the second conductive pad, and wherein the grid connector is configured to receive the data from the printed memory when the subset of the first conductive pads contacts the second conductive pad.

3. The grid connector of claim 2, wherein the subset comprises two or more of the first conductive pads.

4. The grid connector of claim 3, wherein the first conductive pads in the subset are in electrical continuity with one another when the first conductive pads in the subset are in contact with the second conductive pad of the printed memory.

5. The grid connector of claim 3, wherein the first conductive pads that are not in the subset are not in electrical continuity with one another when the first conductive pads in the subset are in contact with the second conductive pad of the printed memory.

6. A system for communicating with a printed memory, comprising: a printed memory comprising: a first substrate; and a plurality of first conductive pads coupled to the first substrate, wherein each of the first conductive pads is recessed with respect to an outer surface of the first substrate; a grid connector comprising: a second substrate; and a plurality of second conductive pads coupled to the second substrate, wherein each of the second conductive pads protrudes outward with respect to an outer surface of the second substrate, wherein different subsets of the second conductive pads are configured to directly contact each of the first conductive pads to allow data to be transmitted between the grid connector and the printed memory when the grid connector is at a 1:1 alignment with respect to the printed memory or at any other angle regardless of an orientation of the printed memory, with respect to the printed memory as long as the first conductive pads are within a boundary of the second conductive pads, and wherein each subset comprises two or more of the second conductive pads; and a computing system in communication with the grid connector, wherein the computing system is configured to communicate with the printed memory via the grid connector when the different subsets of the second conductive pads are in directly contact with each of the first conductive pads.

7. The system of claim 6, wherein the computing system is configured to identify the subsets of the second conductive pads that are in contact with the first conductive pads by determining that the second conductive pads in the subsets have electrical continuity with one another.

8. The system of claim 7, wherein the computing system is configured to identify the second conductive pads in the subsets that are within a predetermined distance of a boundary of each of the first conductive pads.

9. The system of claim 8, wherein the computing system is configured to communicate with the printed memory via the grid connector through the second conductive pads in the subsets, except for the second conductive pads in the subsets that are within the predetermined distance of the boundary of each of the first conductive pads.

10. The system of claim 6, wherein the data transmitted through one of the first conductive pads comprises information about a product to which the printed memory is configured to be attached, and wherein the data transmitted through another one of the first conductive pads comprises information about a location of the one of the first conductive pads.

11. A method for communicating with a printed memory, comprising: placing a grid connector in directly contact with the printed memory, wherein the printed memory comprises a first conductive pad, wherein the grid connector comprises a plurality of second conductive pads, and wherein placing the grid connector in directly contact with the printed memory comprises placing a subset of the second conductive pads of the grid connector in directly contact with the first conductive pad of the printed memory when the grid connector is at a 1:1 alignment with respect to the printed memory or at any angle regardless of an orientation of the printed memory, with respect to the printed memory as long as the first conductive pad is within a boundary of the second conductive pads; and transmitting data between the first conductive pad of the printed memory and the subset of the second conductive pads of the grid connector.

12. The method of claim 11, wherein the subset comprises two or more of the second conductive pads.

13. The method of claim 12, further comprising identifying the subset of the second conductive pads that are in contact with the first conductive pad of the printed memory by determining that the second conductive pads in the subset have electrical continuity with one another.

14. The method of claim 13, further comprising identifying the second conductive pads in the subset that are within a predetermined distance of a boundary of the first conductive pad.

15. The method of claim 14, further comprising transmitting the data between the first conductive pad of the printed memory and the subset of the second conductive pads of the grid connector that are not within the predetermined distance of the boundary, wherein the data is not transmitted through the second conductive pads in the subset that are within the predetermined distance of the boundary.

16. The method of claim 14, wherein at least a portion of the second conductive pads that are not part of the subset do not have electrical continuity with one another.

17. The method of claim 14, further comprising determining a location, an orientation, or both of the printed memory with respect to the grid connector.

18. The method of claim 14, further comprising determining a location, an orientation, or both of the first conductive pad with respect to the printed memory.

19. The method of claim 14, further comprising determining a location, an orientation, or both of the first conductive pad with respect to the grid connector.

20. The method of claim 14, wherein the data transmitted through the first conductive pad comprises information about a product to which the printed memory is to be adhered, wherein the printed memory further comprises a third conductive pad that is used to determine a location, an orientation, or both of the first conductive pad on the printed memory, wherein the data transmitted through the first conductive pad does not comprise the information about the location, the orientation, or both, and wherein the third conductive pad does not comprise the information about the product.

* * * * *